(12) United States Patent
Cannella et al.

(10) Patent No.: US 10,951,171 B2
(45) Date of Patent: Mar. 16, 2021

(54) CONFIGURABLE SWITCHED POWER AMPLIFIER FOR EFFICIENT HIGH/LOW OUTPUT POWER

(71) Applicant: NXP USA, Inc., Austin, TX (US)

(72) Inventors: Maicol Cannella, Antibes (FR); Aurelien Larie, Le Cannet (FR); Stefano Dal Toso, Antibes (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/292,555

(22) Filed: Mar. 5, 2019

(65) Prior Publication Data

US 2020/0195199 A1 Jun. 18, 2020

(30) Foreign Application Priority Data

Dec. 18, 2018 (EP) .................................. 18306718

(51) Int. Cl.
*H03F 3/45* (2006.01)
*H03F 1/02* (2006.01)
(Continued)

(52) U.S. Cl.
CPC .......... *H03F 1/0277* (2013.01); *H03F 3/245* (2013.01); *H03F 3/45179* (2013.01); *H03F 3/68* (2013.01);
(Continued)

(58) Field of Classification Search
CPC ... H03F 1/22; H03F 1/223; H03F 3/45; H03F 3/72
(Continued)

(56) References Cited

U.S. PATENT DOCUMENTS 5,977,828 A 11/1999 Hu et al.
7,474,154 B1 1/2009 Lee et al.
(Continued)

FOREIGN PATENT DOCUMENTS

KR 10-2018-0115404 A1 10/2018

OTHER PUBLICATIONS

Babaie et al., "A Fully Integrated Bluetooth Low-Energy Transmitter in 28 nm CMOS With 36% System Efficiency at 3 dBm", IEEE Journal of Solid-State Circuits, vol. 51, No. 7, 19 pgs. (Jul. 2016).
(Continued)

*Primary Examiner* — Steven J Mottola

(57) ABSTRACT

Power amplifiers and related methods are disclosed having configurable switched mode operation in a high-power mode of operation and a low-power mode of operation. The power amplifiers have a first cascode amplifier coupled to receive a positive differential input and a second cascode amplifier coupled to receive a negative differential input. The first and second cascode amplifiers include output stages and first/second input stages. The first input stages and the second input stages are enabled in a high-power mode of operation. The first input stages are disabled and the second input stages are enabled during a low-power mode of operation. For further embodiments, a switchable clamp operates in the low-power mode to clamp a voltage output for the second input stages. For further embodiments, the output stages are provided a variable voltage bias or are coupled to tunable capacitances that are varied between the low-power and high-power modes.

23 Claims, 6 Drawing Sheets

(51) Int. Cl.
  *H03F 3/24* (2006.01)
  *H03F 3/68* (2006.01)
(52) U.S. Cl.
  CPC .. *H03F 2200/378* (2013.01); *H03F 2200/451* (2013.01); *H03F 2200/513* (2013.01); *H03F 2200/516* (2013.01); *H03F 2200/546* (2013.01); *H03F 2203/21106* (2013.01); *H03F 2203/45024* (2013.01); *H03F 2203/45186* (2013.01)
(58) Field of Classification Search
  USPC .................................. 330/51, 253, 305, 311
  See application file for complete search history.

(56) References Cited

U.S. PATENT DOCUMENTS

| 9,065,386 B2 | 6/2015 | Kimball | |
|---|---|---|---|
| 2006/0119435 A1* | 6/2006 | Oh | H03F 3/72 330/311 |
| 2008/0079499 A1 | 4/2008 | Tsai | |
| 2016/0043698 A1* | 2/2016 | Banerjee | H03F 3/193 330/305 |

OTHER PUBLICATIONS

Sokal et al., "Class E-A New Class of High-Efficiency Tuned Single-Ended Switching Poer Amplifiers", IEEE Journal of Solid-State Circuits, vol. SC-10, No. 3, 9 pgs. (Jun. 1975).

Chung et al., "A Dual-Band 802.11abgn/ac Transceiver With Integrated PA and T/R Switch in a Digital Noise Controlled SoC", IEEE, 8 pgs. (2015).

Apostolidou et al., "A 65 nm CMOS 30 dBm Class-E RF Power Amplifier With 60% PAE and 40% PAE at 16 dB Back-Off", IEEE Journal of Solid-State Circuits, 9 pgs. (2009).

Chen, "Advanced Architectures for Efficient mm-Wave CMOS Wireless Transmitters", Technical Report No. UCB/EECS-2014-42, 149 pgs. (May 2014).

Kee et al., "The Class E/F Family of ZVS Switching Amplifiers", IEEE Transactions on Microwave Theory and Techniques, vol. 51, No. 6, pp. 1677-1690 (Jun. 2003).

* cited by examiner

US 10,951,171 B2

CONFIGURABLE SWITCHED POWER AMPLIFIER FOR EFFICIENT HIGH/LOW OUTPUT POWER

RELATED APPLICATIONS

This application claims priority under 35 USC § 119 to European Patent Application No. 18306718.0 filed on Dec. 18, 2018, and entitled "CONFIGURABLE SWITCHED POWER AMPLIFIER FOR EFFICIENT HIGH/LOW OUTPUT POWER," which application is hereby incorporated by reference in its entirety.

TECHNICAL FIELD

This technical field relates to radio frequency (RF) communications and more particularly to power amplifiers for RF transmitters.

BACKGROUND

Power amplifiers typically reach their maximum efficiency when the largest possible voltage swing is produced on the output. This maximum efficiency corresponds to a high amount of delivered output power. For a radio frequency (RF) power amplifier designed to transmit a phase modulated signal (e.g., Bluetooth and ZigBee protocols), it is often necessary to cover a wide range of output power. This wide range is often needed to comply with communication standards as well as to meet different end-user requirements for the power amplifier circuits. Classic power amplifier structures allow output power to be reduced, for example, by degrading ON resistance in case of a switched mode power amplifier. However, efficiency often drops when backing off from maximum power for these power amplifier structures, particularly where conditions remain the same (e.g., same load resistance and same supply voltage). This loss of efficiency is undesirable.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Power amplifiers and related methods are disclosed having configurable switched mode operation. The switched-mode power amplifier is a radio frequency (RF) amplifier having a reconfigurable architecture that operates in a high-power mode of operation and a low-power mode of operation. The disclosed power amplifier structures provide high efficiency operation at two different output powers that are far from each other, such as 10 dBm (decibel-milliwatts) difference or greater in output power levels. A variety of additional or different features and variations can be implemented.

For one example embodiment described herein, a power amplifier is configured to operate in different working modes that set the maximum efficiency at two different output powers far from each other (e.g. 10 dBm or greater). This efficient operation is achieved through dynamic biasing of gate voltages for cascode output transistors as a function of the high-power or low-power modes. Further, configurable clamping transistors are enabled only in the low-power mode to ensure high power efficiency. Other features are also disclosed.

Figure 1:
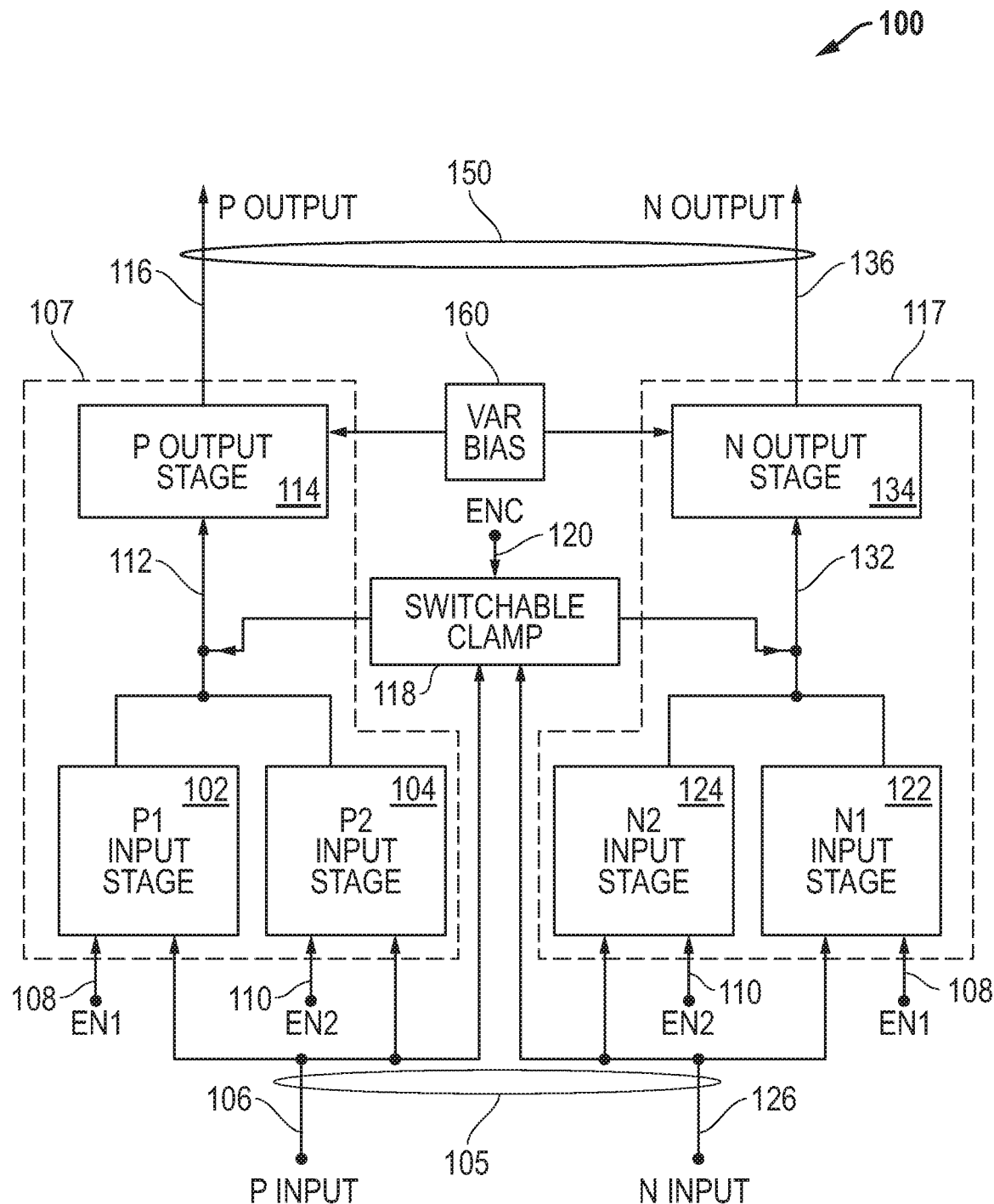
FIG. 1 is a block diagram of an example embodiment for a power amplifier having differential input/outputs and high efficiency operation in both a low-power operational mode and a high-power operational mode.

FIG. 1 is a block diagram of an example embodiment for a power amplifier 100 having a differential input 105 and a differential output 150. The differential input 105 includes a positive (P) input 106 and a negative (N) input 126. The differential output 150 includes a positive (P) output 116 and a negative (N) output 136. A positive-side cascode amplifier 107 is coupled to receive the P input 106 and has the P output 116 as an amplified output. A negative-side cascode amplifier 117 is coupled to receive the N input 126 and has the N output 136 as an amplified output. The differential output 150 can then be provided to transmit circuitry.

For the positive-side cascode amplifier 107, the P input 106 is coupled to a first positive (P1) input stage 102 and a second positive (P2) input stage 104. The outputs of the input stages 102/104 are combined and provided as output signal 112 to a positive (P) output stage 114. The P output stage 114 generates the P output 116, and the P output stage 114 receives a variable bias 160. For the negative-side cascode amplifier 117, the N input 126 is coupled to a first negative (N1) input stage 122 and a second negative (N2) input stage 124. The outputs of the input stages 122/124 are combined and provided as output signal 132 to a negative (N) output stage 134. The N output stage 134 generates the N output 136, and the N output stage 134 receives a variable bias 160. The variable bias 160 applies a low voltage during the high-power mode of operation (e.g., to bias the P/N output stages 114/134 in a saturation zone where transistors are used) and a high voltage during the low-power mode of operation (e.g., to bias the P/N output stages 114/134 in a triode zone where transistors are used). A switchable clamp 118 is coupled to the outputs of the N1/N2 input stages 102/104 as well as to the P1/P2 input stages 122/124. The switchable clamp 118 is configured to clamp the voltage at the output of the N2 input stages 104/124 and thereby the output signal 112 during the low-power mode of operation. The switchable clamp 118 is disable during the high-power mode of operation.

The low-power of operation and the high-power mode of operation for the power amplifier 100 is provided through control of a first enable signal (EN1) 108, a second enable signal (EN2) 110, and a clamp enable signal (ENC) 120. The first enable signal 108 is coupled to the P1 input stage 102 and the N1 input stage 122. The second enable signal 110 is coupled to the P2 input stage 104 and the N2 input stage 124. The clamp enable signal 120 is coupled to the switchable clamp 118. During high-power mode of operation for the power amplifier 100, the first enable signal 108 is configured to enable operation of the P1 input stage 102 and the N1 input stage 122; the second enable signal 110 is configured to enable the operation of the P2 input stage 104 and the N2 input stage 124; and the clamp enable signal 120 is configured to disable the operation of the switchable clamp 118. Further, the variable bias 160 is configured to provide a low voltage bias. During low-power mode of operation for the power amplifier 100, the first enable signal 108 is configured to disable operation of the P1 input stage 102 and the N1 input stage 122; the second enable signal 110 is configured to enable the operation of the P2 input stage 104 and the N2 input stage 124; and the clamp enable signal 120 is configured to enable the operation of the switchable clamp 118. Further, the variable bias 160 is configured to provide a high voltage bias. This operation is summarized in the TABLE below.

TABLE

HIGH/LOW POWER MODES

| Circuit Block | High-Power Mode | Low-Power Mode |
| --- | --- | --- |
| N1 Input Stage 102 | ENABLED | DISABLED |
| N2 Input Stage 104 | ENABLED | ENABLED |
| P1 Input Stage 122 | ENABLED | DISABLED |
| P2 Input Stage 124 | ENABLED | ENABLED |
| Switchable Clamp 118 | DISABLED | ENABLED |
| Variable Bias 160 | Low Voltage Bias | High Voltage Bias |

It is noted that a high logic level (e.g., logic 1) can be used to enable circuit operation, and a low logic level (e.g., logic 0) can be used to disable circuit operation. It is further noted that an opposite logic polarity could also be used for these signals. For one embodiment, the clamp enable signal (ENC) 120 can be an inverted version of the first enable signal (EN1). For one embodiment, the second enable signal (EN2) 110 can be removed where there are no operational modes for the power amplifier 100 in which the P2 input stage 104 and the N2 input stage 124 will be disabled. Other variations could also be implemented.

As described with respect to FIGS. 2A-2B below, the N1/P1 input stages 102/122 are preferably implemented using NMOS (n-channel metal-oxide-semiconductor) transistors. As further described below, the switchable clamp 118 is preferably implemented with PMOS (p-channel metal-oxide-semiconductor) transistors that are enabled only in low-power mode. The N2/P2 input stages 104/124 as well as the P/N output stages 114/134 can also be implemented as NMOS transistors for these preferred embodiments. It is further noted that input stages 102/104/122/124 combined with the output stages 114/134 are configured to provide the positive-side cascode amplifier 107 and the negative-side cascode amplifier 117.

The disclosed embodiments provide high efficiency at different output powers. For example, efficiency is provided for both high power (e.g., 10 dBm) and low power (e.g., 0 dBm) output modes with the same reconfigurable power amplifier. The embodiments can also use multiple power-efficient supply voltages. For example, an input/output (I/O) supply voltage having a high voltage (e.g., 1.8 volts which can be regulated to 1.6 volts) can be used as well as a core voltage having a low voltage (e.g., 1.1 volts which can be regulated to 0.9 volts). The power amplifier embodiments are designed for efficient operation with high power outputs using a high supply voltage (e.g., regulated 1.6 volts). The configurable architecture described herein allows for this same architecture to provide efficient operation with low power outputs as well. For one embodiment, a complementary PMOS/NMOS clamp approach is used with a multi-mode cascode structure to achieve a 6 dB maximum output power reduction without causing reliability issues.

As further described with respect to FIGS. 2A-B below, the power amplifiers easily switch between modes of operation through enable signals applied to the reconfigurable architecture. For the high-power mode of operation, the power amplifier effectively operates as an NMOS only switched-mode differential power amplifier. On each of the positive-side and negative-side for the differential design, there are stacked input/output NMOS transistors that form switch and output transistors for a cascode amplifier. The load can be a transformer with tunable parallel capacitors at each of the positive/negative outputs. The tunable capacitors can be used, for example, to tune differently in the two working modes to compensate for the output capacitance variation of the power amplifier circuitry when re-configured for the different modes of operation. For one embodiment, the center tap for the transformer is biased at a high supply voltage, for example, regulated through a low drop-out (LDO) regulator. After reconfiguration, the power amplifier effectively operates as a complementary NMOS/PMOS power amplifier during the low-power mode of operation. For this low-power mode, the input signal is fed (e.g., through a logic gate) to the gates of PMOS transistors having their drains connected to clamp the drains of the NMOS switch transistors, which have their sources connected to a low supply voltage. This structure creates a bridge architecture. The center tap of the output transformer is left floating for the low-power mode by opening a switch or otherwise disabling the LDO regulator.

The configurable power amplifiers described herein can also utilize the switchable clamp, the variable bias, or the output capacitance tuning features to help provide high efficiency at different power modes (e.g., separated by 10 dBm or more). First, the clamp are activated in a low-power mode, such as through PMOS clamping circuits coupled to a low supply voltage that are enabled to clamp the drain of the cascode switch transistors to the low supply voltage. For the high-power mode, the clamp transistors are disabled. Second, dynamic biasing of the gates for cascode output transistors is applied such that a low bias voltage is applied to the gates during the high-power mode and a high bias voltage is applied to the gates during the low-power mode. For example, the gate bias voltage can be set to a first low voltage (e.g., 1.2 volts) in the high-power mode and to a second high voltage (e.g., 1.8 volts) in the low-power mode. The second voltage is higher than the first voltage. This higher second voltage can also be configured such that it is higher than the first lower voltage plus the threshold voltage of the cascode output transistors. It is further noted that tunable capacitors can be provided in the output transformer and can be used to re-tune the output in order to compensate for structure capacitance variation between operational modes.

Figure 2A:
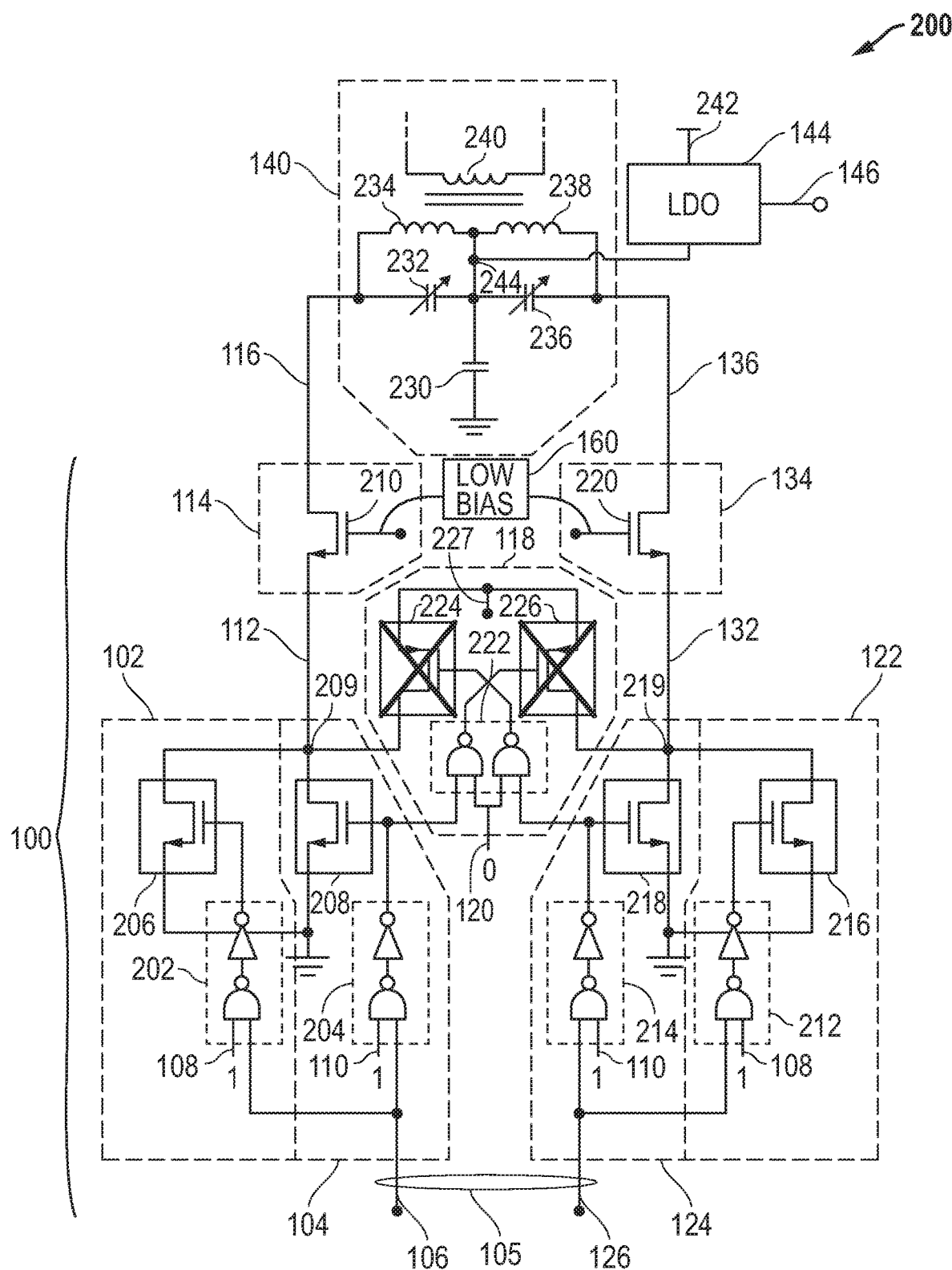
FIG. 2A is a circuit diagram of an example embodiment for a power amplifier operating in high-power mode to drive a load where two cascode input stages and a cascode output stage are operating for the positive-side and negative-side cascode amplifiers.
Figure 2B:
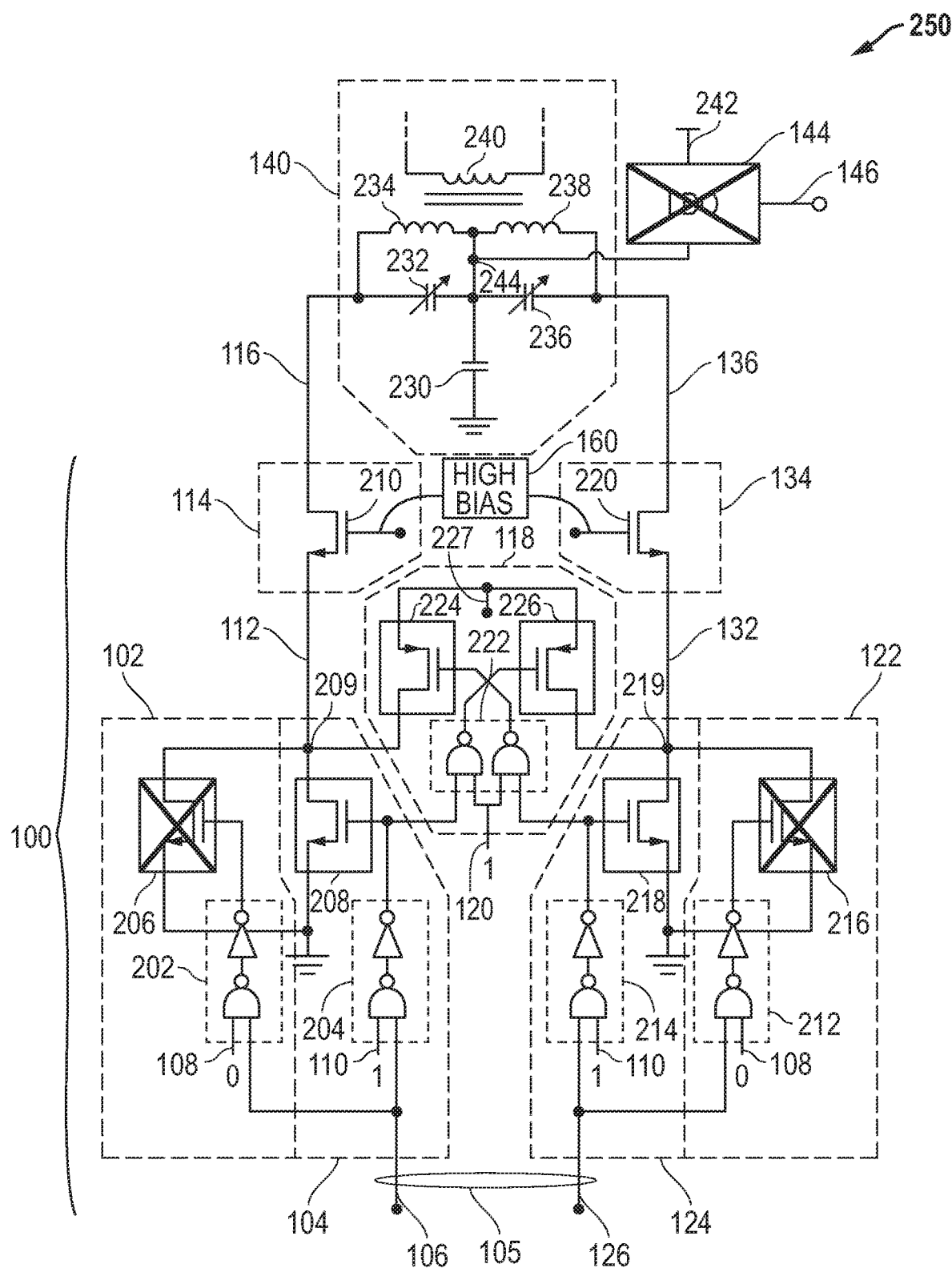
FIG. 2B is a circuit diagram of an example embodiment for a power amplifier operating in low-power mode to drive a load where one cascode input stage, a switchable clamp, and a cascode output stage are operating for the positive-side and negative-side cascode amplifiers.

One example circuit embodiment for the disclosed power amplifiers is now described in more detail with respect to FIGS. 2A-B.

FIG. 2A is a circuit diagram of an example embodiment 200 for a power amplifier 100 operating in high-power mode to drive a load 140. For example embodiment 200, the first enable signal 108 is set to enable operation of N1/P1 input stages 102/122 (e.g., set to logic 1), and the second enable signal 110 is set to enable operation of the N2/P2 input stages 104/124 (e.g., set to logic 1). The clamp enable signal 120 is set to disable operation of the switchable clamp 118 (e.g., set to logic 0). In addition, the gate bias voltage for the NMOS transistors 114/134 can be a low bias voltage (Vcasc), for example, a bias voltage of 1.2 volts.

For example embodiment 200, the load 140 is a tunable transformer circuit. The tunable transformer circuit 140 includes a capacitor 230 coupled between center tap node 244 and ground. A tunable capacitance 232 (e.g., one or more capacitors) and an inductance 234 (e.g., one or more inductors) are coupled in parallel between node 244 and the P output 116. A tunable capacitance 236 (e.g., one or more capacitors) and an inductance 238 (e.g., one or more inductors) are coupled in parallel between node 244 and the N output 136. Coils 240 provide the transmit side of a transformer that is effectively formed between coils 240 and inductors 234/238. A low dropout (LDO) regulator 144 is coupled between a voltage supply 242 and node 244. The LDO regulator 144 is also coupled to a regulator enable signal 146, and the LDO regulator 144 is enabled during the high-power mode of operation for the power amplifier 100.

For the positive-side, the P1 input stage 102 includes MOS (metal-oxide-semiconductor) transistor switches 206 having their gates coupled to the output of an enable circuit 202, which is coupled to receive the first enable signal 108. For the embodiment 200, the enable circuit 202 includes a NAND gate followed by an inverter. The transistor switches 206 can be implemented as NMOS transistors with their sources coupled to ground (e.g., Vss) and their drains coupled to node 209. For example, binary weighted NMOS transistors can be used for transistor switches 206. Similarly, the P2 input stage 104 includes MOS transistor switches 208 having their gates coupled to the output of an enable circuit 204, which is coupled to receive the second enable signal 110. For the embodiment 200, the enable circuit 204 includes a NAND gate followed by an inverter. The transistor switches 208 can be implemented as NMOS transistors with their sources coupled to ground and their drains coupled to node 209. For example, binary weighted NMOS transistors can be used for transistor switches 208. The P output stage 114 can be implemented as an NMOS transistor 210 with its source coupled to node 209, its gate coupled to variable bias voltage 160, and its drain coupled to provide the P output 116.

For the negative-side, the P1 input stage 122 includes MOS transistor switches 216 having their gates coupled to the output of an enable circuit 212, which is coupled to receive the first enable signal 108. For the embodiment 200, the enable circuit 212 includes a NAND gate followed by an inverter. The transistor switches 216 can be implemented as NMOS transistors with their sources coupled to ground (e.g., Vss) and their drains coupled to node 219. For example, binary weighted NMOS transistors can be used as transistor switches 216. Similarly, the P2 input stage 124 includes MOS transistor switches 218 having their gates coupled to the output of an enable circuit 214, which is coupled to receive the second enable signal 110. For the embodiment 200, the enable circuit 214 includes a NAND gate followed by an inverter. The transistor switches 218 can be implemented as NMOS transistors with their sources coupled to ground and their drains coupled to node 219. For example, binary weighted NMOS transistors can be used as transistor switches 218. The N output stage 134 can be implemented as an NMOS transistor 220 with its source coupled to node 219, its gate coupled to variable bias voltage 160, and its drain coupled to provide the N output 136.

The switchable clamp 118 includes positive-side clamp transistors 224, negative-side clamp transistors 226, and enable circuit 222. For the embodiment 200, the enable circuit 222 includes a first NAND gate that is coupled to receive the P input 106 through enable circuit 204, to receive the clamp enable signal 120, and to control the gates of the negative-side clamp transistors 226. The enable circuit 222 also includes a second NAND gate that is coupled to receive the N input 126 through enable circuit 214, to receive the clamp enable signal 120, and to control the gates of the positive-side clamp transistors 224. The clamp transistors 224 and 226 can be implemented as PMOS transistors having their sources connected to supply voltage 227 and their drains connected to node 209 and node 219, respectively. For example, binary weighted PMOS transistors can be used as clamp transistors 224, and binary weighted PMOS transistors can be used as clamp transistors 226. It is noted that this binary weighting preferably matches the binary weighting for the NMOS transistors 204/214.

It is noted that different power domains can be provided for the embodiment 200. The supply voltage 227 can be a low supply voltage (Vdd_low), for example, a voltage of 1.1 volts. The supply voltage 242 for the LDO regulator 144 can be a high supply voltage (Vdd_high), for example, a voltage of 1.8 volts. It is further noted that the LDO regulator 144 can be configured to regulate the voltage on center tap node 244 to 1.6 volts during operation. In addition, it is noted that the gate bias voltage for the NMOS transistors 114/134 can be varied between a low bias voltage (Vcasc), for example, a low bias voltage of 1.2 volts, and a high bias voltage (Vcasc), for example, a high bias voltage of 1.8 volts.

During the high-power mode operation as shown for embodiment 200 in FIG. 2A, power amplifier 100 effectively operates as a switched-mode differential power amplifier. Further, the circuits can be sized to achieve high efficiency by achieving zero voltage switching or zero derivative voltage switching. The load 140 operates as a transformer-based balun with tunable capacitances 232/236, and load 140 can be represented as a parallel RLC (resistor-inductor-capacitor) network. The center tap node 244 for the transformer is biased at a high supply voltage (e.g., 1.6 volts through LDO regulator 144) and is connected to ground with a capacitor 230 to provide a low impedance path for even harmonic currents.

FIG. 2B is a circuit diagram of an example embodiment 250 for the power amplifier 100 of FIG. 2A when it is operating in low-power mode to drive load 140. For example embodiment 250, the first enable signal 108 is set to disable operation of N1 and P1 input stages 102/122 (e.g., set to logic 0), and the second enable signal 110 is set to enable operation of the N2 and P2 input stages 104/124 (e.g., set to logic 1). Further, the clamp enable signal 120 is set to enable operation of the switchable clamp 118 (e.g., set to logic 1). In addition, the gate bias voltage for the NMOS transistors 114/134 can be a high bias voltage (Vcasc), for example, a bias voltage of 1.8 volts. The circuits for example embodiment 250 are the same as described above for example embodiment 200.

As shown for the switchable clamp 118, parallel PMOS transistors 224/226 are provided on each side of the differential power amplifier 100. The PMOS transistors 224, for example, can be binary weighted transistors that operate in a bridge configuration with NMOS transistors 218. Similarly, the PMOS transistors 226, for example, can be binary weighted transistors that operate in a bridge configuration with NMOS transistors 208. The PMOS transistors 224/226 can have their sources connected a low voltage supply 227 to avoid reliability issues. Further, the PMOS transistors 224/226 can also be designed to match the series resistance for the corresponding NMOS devices 208/218. The gates of PMOS transistors 224 are driven by the inverse of the N input 126 through enable circuit 222 so that they are ON when the NMOS transistors 218 are ON and the NMOS transistors 208 are OFF. The gates of PMOS transistors 226 are driven by the inverse of the P input 106 through enable circuit 222 so that they are ON when the NMOS transistors 208 are ON and the NMOS transistors 218 are OFF. It is noted that the NMOS transistors 208/218 can be configured to represent the least-significant-bits (LSBs) where binary weighting is used for NMOS transistors 204/208 and NMOS transistors 214/218.

During the low-power mode, the center tap node 244 of the transformer load 140 is left floating by disconnecting it from the LDO regulator 144 (e.g., through a switch) or by switching the output impedance of the LDO regulator 144 to a high impedance state, either of which can be controlled by enable signal 146. The tunable capacitances 232/234 are re-tuned to compensate for structure capacitance variations.

The output transistors 114/134, which worked as a cascode for high power mode, are now biased with a high gate voltage. For example, a voltage of the low supply voltage plus a threshold voltage for transistors 114/134 can be used (e.g., 1.1 volts plus 0.6 volts or higher). The output transistors 114/134 effectively operate as closed switches, letting the signals 112/132 on their sources transfer to the output signals 116/135 on their drains with a small voltage drop.

It is noted that the first and second input stages 102/104/122/124 for FIGS. 2A-B can be implemented as parallel transistors. These parallel transistors can be grouped in N+M binary weighted slices including N LSBs (least significant bits) and M MSBs (most significant bits). Each slice can be activated/deactivated by a control bit represented by the first and second enable signals 108/110. In particular, enable signal 108 provides the control bits for the M MSB transistors, and enable signal 110 provides the control bits for the N LSB transistors. Switching off the transistors in the first input stages 102/122 effectively increases the switch series resistance reducing the output voltage swing and so the output power for the low-power mode.

It is further noted that the devices for the power amplifier 100 of FIGS. 2A-B can be sized to allow a certain maximum output power to be reached and, once the switch transistors 102/104/122/124 are released, to produce a voltage waveform on outputs 116/136 (e.g., damped sinusoidal oscillation) that does not exceed two times the high supply voltage at its peak (e.g., for reliability reasons) and reaches zero volts or near zero volts when the switch transistors 102/104/122/124 are closed again. Further, the devices can be sized and configured such that the zero crossing can correspond to a minimum of a sinusoid, and the derivative of the signal can be zero (e.g., zero derivative voltage switching (ZdVS) condition).

Figure 3A:
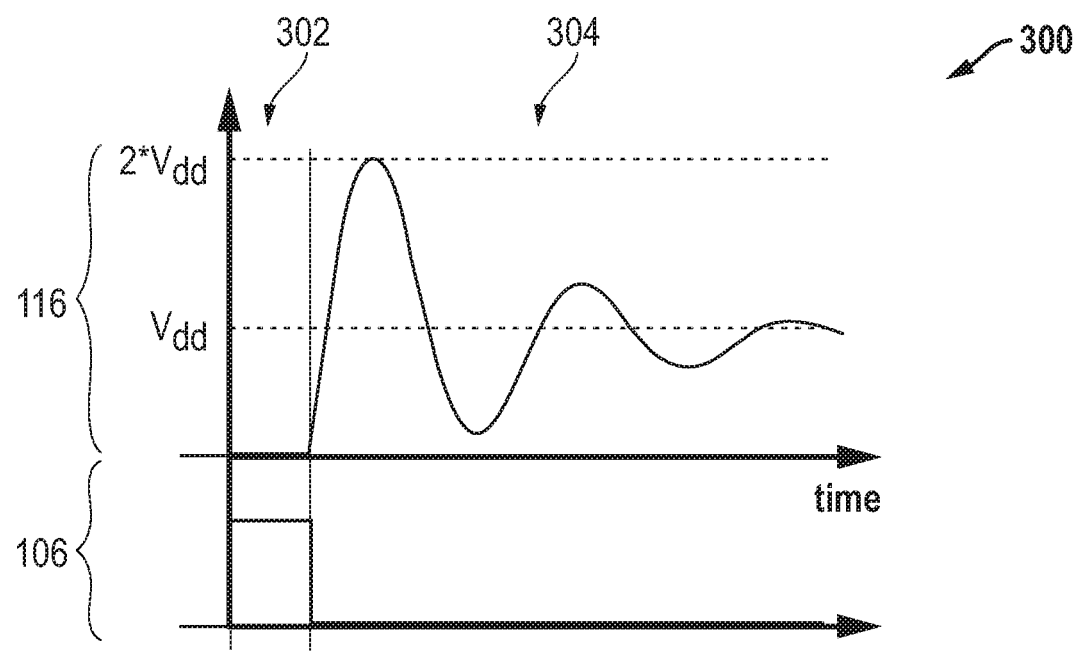
FIG. 3A provides a signal diagram of an example embodiment for input/output signals for the high-power mode of operation for the embodiment described in FIG. 2A where a single input pulse is applied.

FIG. 3A provides a signal diagram of an example embodiment 300 for input/output signals for the high-power mode of operation for the embodiment described in FIG. 2A where a single input pulse is applied. For embodiment 300, the P input 106 is a high logic level during pulse region 302 and a low logic level after the pulse in non-pulse region 304. While the P input 106 is high, the P output 116 will be held at ground. Looking to FIG. 2A, it is seen that the node 209 is held at ground when the P input 106 is high. Once the P input 106 goes low, the P output 116 rises to twice the high voltage supply (2*Vdd), falls to near zero, and then settles at the high voltage (Vdd). Looking again to FIG. 2A, the active part of the power amplifier 100 includes the NMOS switch transistors 206/208/216/218 that are stacked with the NMOS output transistors 114/134. Although P input 106 and P output 116 are shown for embodiment 300, it is understood that the N input 126 and N output 136 would be similar.

Figure 3B:
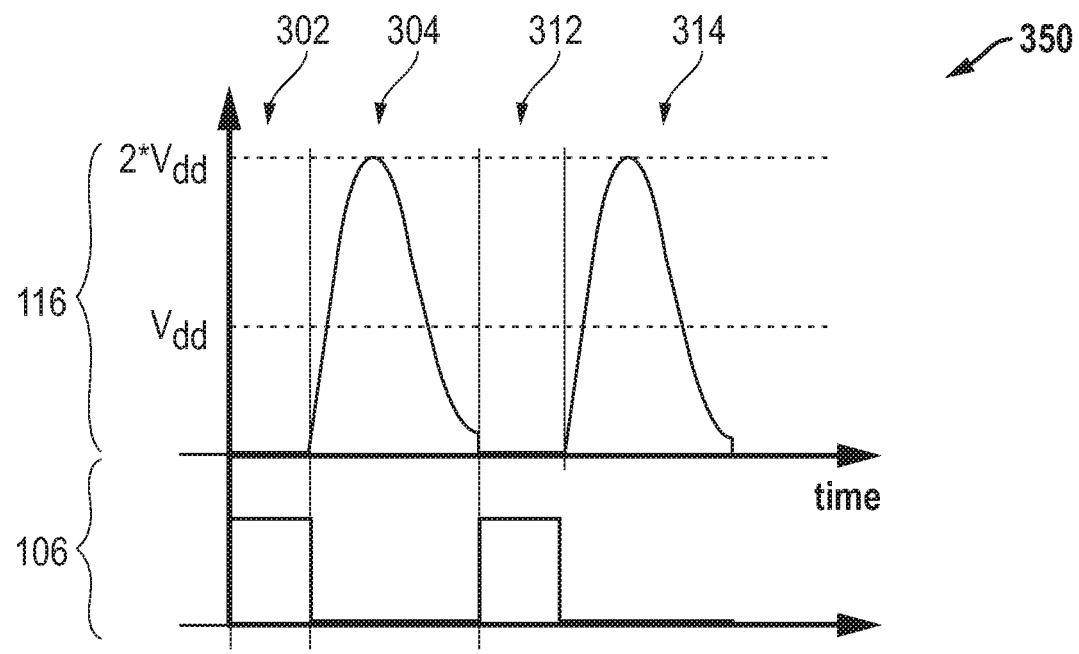
FIG. 3B provides a signal diagram of an example embodiment for input/output signals for the high-power mode of operation for the embodiment described in FIG. 2A where a multiple input pulses are applied.

FIG. 3B provides a signal diagram of an example embodiment 350 for input/output signals for the high-power mode of operation for the embodiment described in FIG. 2A where a multiple input pulses are applied. For embodiment 350, the P input 106 is a high logic level during pulse regions 302 and 312, and the P input 106 is a low logic level after the pulses in non-pulse regions 304 and 214. As above, while the P input 106 is high, the P output 116 will be held at ground. Once the P input 106 goes low in non-pulse region 304, the P output 116 rises to twice the high voltage supply (2*Vdd) and then drops close to zero as it attempts to settle at the high voltage (Vdd) as shown in FIG. 2A. The next pulse in pulse region 312 then drives the P output 116 back to ground. Once the P input 106 again goes low in non-pulse region 314, the P output 116 rises to twice the high voltage supply (2*Vdd) and then drops close to zero as it again attempts to settle at the high voltage (Vdd). Although P input 106 and P output 116 are shown for embodiment 350, it is understood that the N input 126 and N output 136 would be similar.

For one embodiment, the NMOS output transistors 114/134 are a high-voltage transistor whose gates are biased such that the drain voltages for the NMOS switch transistors 206/208/216/218 do not exceed a maximum core voltage (e.g., 1.1 volts) when the NMOS switch transistors 206/208/216/268 are open. Further, the drain voltages for the NMOS output transistors 114/134 are designed to rise to twice the high supply voltage (2*Vdd). In operation, the NMOS output transistors 114/134 protect the NMOS switch transistors 206/208/216/218.

Figure 4:
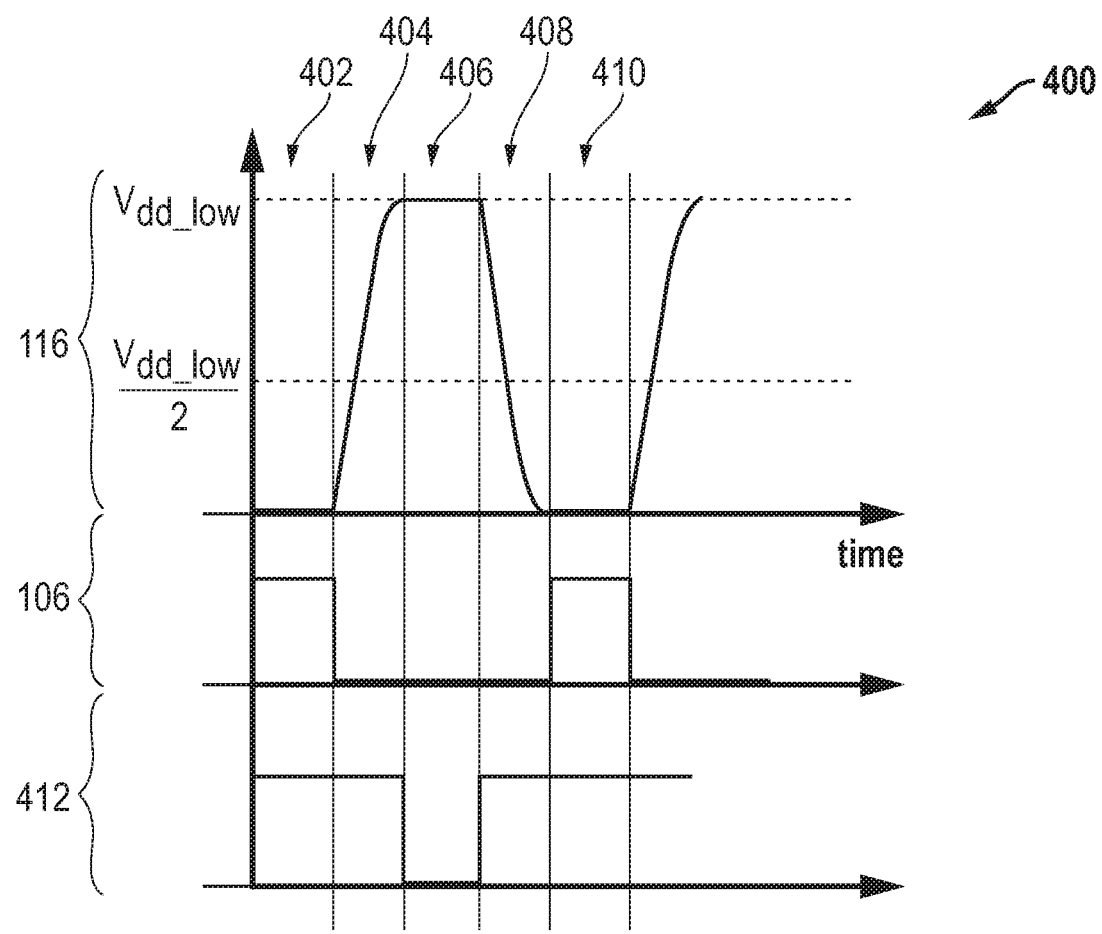
FIG. 4 provides a signal diagram of an example embodiment for input/output signals for the low-power mode of operation for the embodiment described in FIG. 2B.

FIG. 4 provides a signal diagram of an example embodiment 400 for input/output signals for the low-power mode of operation for the embodiment described in FIG. 2B. When a differential input signal 105 is applied, circuit symmetry provides for a constant voltage of one-half of the low supply voltage (Vdd_low) to be artificially generated at the center tap node 244. The circuit can then be analyzed with a single-ended equivalent assuming the center tap is biased to one-half of the low supply voltage. The NMOS switch transistors 208 are ON when P input 106 is high during pulse regions 402 and 410, and P output 116 is tied to ground (e.g. Vss). When the NMOS switch transistors 208 turn OFF in the non-pulse regions 404, the P output 116 rises towards twice the center tap voltage or Vdd_low for this example embodiment. The P output 116 will reach this Vdd_low voltage for region 406 in half of the time needed to return to zero, which is when the PMOS clamp transistors 224 switch ON (e.g., in ZVS and ZdVS condition) as they are activated by the gate signal 412 provided by enable circuit 222. At this point, the load 140 is charged with the opposite polarity with respect to the starting point and, once the PMOS clamp transistors 224 are released in region 408, the P output 116 will drop towards zero and naturally create ZVS and ZdVS conditions. The operation then starts over again with the new pulse in region 410. Although P input 106 and P output 116 are shown for embodiment 400, it is understood that the N input 126 and N output 136 would be similar It is noted that the complementary NMOS/PMOS structure is highly reliable in low-power mode due to the NMOS output transistors 114/134, which prevent the drain voltages of the NMOS switch transistors 208/218/206/216 and those of the PMOS clamps 224/226 from swinging above a low supply voltage (e.g., 1.1 volts).

Figures 5A, 5B:
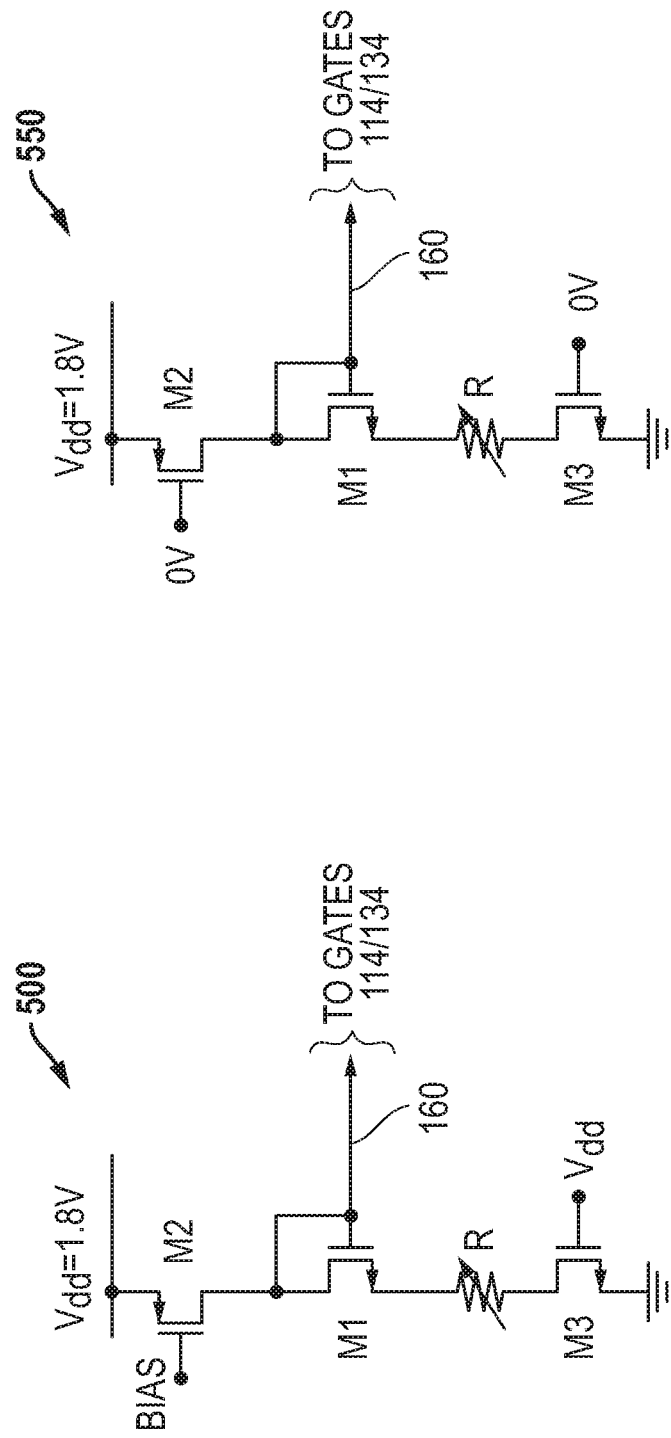
FIGS. 5A-B provide example embodiments for gate voltage generation circuits for the variable bias voltage during high-power and low-power modes of operation.

FIGS. 5A-B provide example embodiments for gate voltage generation circuits for the variable bias 160 that is applied to the gates of NMOS output transistors 114/134.

FIG. 5A provides an example embodiment 500 for a gate voltage generation circuit for the high-power mode of operation. Transistors M1, M2 and M3 are connected between a high supply voltage (Vdd) and ground (Vss). The high supply voltage can be, for example, 1.8 volts. A fixed current source is created by PMOS transistor M2, which has a voltage bias (BIAS) applied to its gate. This fixed current source is applied to NMOS transistor M1, which is matched with the NMOS output transistors 114/134 to track variations of the transistor threshold voltage. The NMOS transistor M1 is connected in series with a resistor (R) that is sized to achieve a desired voltage drop. The resistor (R) can be implemented as a trimmable resistor bank or other variable resistor circuit to provide flexibility. NMOS transistor M3 is connected to provide a low series resistance and has its gate connected to the high supply voltage (Vdd). The embodiment 500 thereby sets the variable bias 160 to a low supply voltage, such as 1.2 volts, that is then provided to the gates of the NMOS output transistors 114/134.

FIG. 5B provides an example embodiment 550 where the gate voltage circuit shown in FIG. 5A is adjusted for a low-power mode of operation. The gate of PMOS transistor M2 is tied to ground to pass the high supply voltage (Vdd) to the NMOS transistor M1. The gate of NMOS transistor M3 is tied to ground to turn it OFF. The embodiment 550 thereby sets the variable bias 160 to a high supply voltage, such as 1.8 volts, that is then provided to the gates of the NMOS output transistors 114/134.

As described herein, a variety of embodiments can be implemented and different features and variations can be implemented, as desired.

For one embodiment, a power amplifier is disclosed including a differential input including a positive (P) input and a negative (N) input, a first cascode amplifier coupled to receive the P input, and a second cascode amplifier coupled to receive the N input. The first cascode amplifier includes an output stage having a positive (P) output, a first input stage coupled to the output stage, and a second input stage coupled to the output stage. For this first cascode amplifier, the first input stage and the second input stage are enabled in a high-power mode of operation, and the first input stage is disabled and the second input stage is enabled during a low-power mode of operation. The a second cascode amplifier includes an output stage having a negative (N) output, a first input stage coupled to the output stage, and a second input stage coupled to the output stage. For this second cascode amplifier, the first input stage and the second input stage are enabled in a high-power mode of operation, and the first input stage is disabled and the second input stage is enabled during a low-power mode of operation.

In additional embodiments, the first input stages and the second input stages for the first and second cascode amplifiers each include a plurality of NMOS transistors. In further embodiments, the plurality of NMOS transistors include binary-weighted NMOS transistors.

In additional embodiments, the output stages for the first and second cascode amplifiers include an NMOS transistor. In further embodiments, the gates for the NMOS transistor are biased with a first voltage in the high-power mode of operation and a second voltage during the low-power mode of operation, and the second voltage is higher than the first voltage.

In additional embodiments, the power amplifier also includes a switchable clamp coupled to an output for the first and second input stages for the first and second cascode amplifiers, and the switchable clamp is enabled during the low-power mode of operation to hold the output to a voltage. In further embodiments, the first input stage and the second input stages for the first and second cascode amplifiers each include a plurality of NMOS transistors, and the switchable clamp includes first PMOS transistors coupled to the output for the second input stage of the first cascode amplifier and second PMOS transistors coupled to the output for the second input stage of the second cascode amplifier. In still further embodiments, the power amplifier also includes a clamp enable signal coupled to an enable circuit with the switchable clamp.

In additional embodiments, the power amplifier also includes a first enable signal coupled to enable circuits within the first input stages and a second enable signal coupled to enable circuits within the second input stages.

In additional embodiments, the power amplifier also includes a first tunable capacitance coupled to the output stage for the first cascode amplifier and a second tunable capacitance coupled to the output stage for the second cascode amplifier. Further, the first and second tunable capacitances have varied capacitances based upon the low-power and high-power modes of operation.

For one embodiment, a method to amplify output signals is disclosed including receiving a differential input including a positive (P) input and a negative (N) input, providing the P input to a first cascode amplifier, and providing the N input to a second cascode amplifier. The first cascode amplifier includes an output stage having a positive (P) output, a first input stage coupled to the output stage, and a second input stage coupled to the output stage. The second cascode amplifier includes an output stage having a negative (N) output, a first input stage coupled to the output stage, and a second input stage coupled to the output stage. For a high-power mode of operation, the method includes enabling the first input stages and the second input stages for the first and second cascode amplifiers. For a low-power mode of operation, the method includes disabling the first input stages for the first and second cascode amplifiers and enabling the second input stages for the first and second cascode amplifiers.

In additional embodiments, the first input stages and the second input stages for the first and second cascode amplifiers each includes a plurality of NMOS transistors. In further embodiments, the plurality of NMOS transistors include binary-weighted NMOS transistors.

In additional embodiments, the output stages for the first and second cascode amplifiers include an NMOS transistor. In further embodiments, the method includes biasing the gates for the NMOS transistor with a first voltage in the high-power mode of operation and a second voltage during the low-power mode of operation, and the second voltage is higher than the first voltage.

In additional embodiments, the method includes enabling a switchable clamp during the low-power mode of operation, the switchable clamp being coupled to an output for the first and second input stages for the first and second cascode amplifiers, and holding the output to a voltage during the low-power mode of operation. For further embodiments, the first input stages and the second input stages for the first and second cascode amplifiers each includes a plurality of NMOS transistors, and the switchable clamp includes first PMOS transistors coupled to the output for the second input stage of the first cascode amplifier and second PMOS transistors coupled to the output for the second input stage of the second cascode amplifier. In still further embodiments, the method includes applying a clamp enable signal to an enable circuit within the switchable clamp to enable and to disable the switchable clamp.

In additional embodiments, the method also includes applying a first enable signal to enable circuits within the first input stage to enable and disable the first input stages, and the method also includes applying a second enable signal to enable circuits within the second input stages to enable and disable the second input stages.

In additional embodiments, the method also includes loading the first cascode amplifier with a first tunable capacitance, loading the second cascode amplifier with a second tunable capacitance, and varying the first and second tunable capacitances based upon the low-power and high-power modes of operation.

It is further noted that the functional blocks, components, systems, devices, or circuitry described herein can be implemented using hardware, software, or a combination of hardware and software. For example, the disclosed embodiments can be implemented using one or more programmable circuits that are programmed to perform the functions, tasks, methods, actions, or other operational features described herein for the disclosed embodiments. The one or more programmable circuits can include, for example, one or more processors or configurable logic devices (CLDs) or a combination thereof. The one or more processors can be, for example, one or more central processing units (CPUs), controllers, microcontrollers, microprocessors, hardware accelerators, ASICs (application specific integrated circuit), or other integrated processing devices. The one or more CLDs can be, for example, one or more CPLDs (complex programmable logic devices), FPGAs (field programmable gate arrays), PLAs (programmable logic array), reconfigurable logic circuits, or other integrated logic devices. Further, the programmable circuits, including the one or more processors, can be programmed to execute software, firmware, code, or other program instructions that are embodied in one or more non-transitory tangible computer-readable mediums to perform the functions, tasks, methods, actions, or other operational features described herein for the disclosed embodiments. The programmable circuits, including the one or more CLDs, can also be programmed using logic code, logic definitions, hardware description languages, configuration files, or other logic instructions that are embodied in one or more non-transitory tangible computer-readable mediums to perform the functions, tasks, methods, actions, or other operational features described herein for the disclosed embodiments. In addition, the one or more non-transitory tangible computer-readable mediums can include, for example, one or more data storage devices, memory devices, flash memories, random access memories, read only memories, programmable memory devices, reprogrammable storage devices, hard drives, floppy disks, DVDs, CD-ROMs, or any other non-transitory tangible computer-readable mediums. Other variations can also be implemented while still taking advantage of the techniques described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A power amplifier, comprising:
   a differential input including a positive (P) input and a negative (N) input;
   a first cascode amplifier coupled to receive the P input comprising:
   an output stage having a positive (P) output;
   a first input stage coupled to the output stage; and
   a second input stage coupled to the output stage;
   wherein the first input stage and the second input stage are enabled in a high-power mode of operation; and
   wherein the first input stage is disabled and the second input stage is enabled during a low-power mode of operation;
   a second cascode amplifier coupled to receive the N input comprising:
   an output stage having a negative (N) output;
   a first input stage coupled to the output stage; and
   a second input stage coupled to the output stage;
   wherein the first input stage and the second input stage are enabled in a high-power mode of operation; and
   wherein the first input stage is disabled and the second input stage is enabled during a low-power mode of operation,
   wherein the output stages for the first and second cascode amplifiers comprise an NMOS transistor, and the gates for the NMOS transistor are biased with a first voltage in the high-power mode of operation and a second voltage during the low-power mode of operation, the second voltage being higher than the first voltage.

2. The power amplifier of claim 1, wherein the first input stages and the second input stages for the first and second cascode amplifiers each comprises a plurality of NMOS transistors.

3. The power amplifier of claim 2, wherein the plurality of NMOS transistors comprise binary-weighted NMOS transistors.

4. A power amplifier, comprising:
   a differential input including a positive (P) input and a negative (N) input;

a first cascode amplifier coupled to receive the P input comprising:
an output stage having a positive (P) output;
a first input stage coupled to the output stage; and
a second input stage coupled to the output stage;
wherein the first input stage and the second input stage are enabled in a high-power mode of operation; and
wherein the first input stage is disabled and the second input stage is enabled during a low-power mode of operation;
a second cascode amplifier coupled to receive the N input comprising:
an output stage having a negative (N) output;
a first input stage coupled to the output stage; and
a second input stage coupled to the output stage;
wherein the first input stage and the second input stage are enabled in a high-power mode of operation; and
wherein the first input stage is disabled and the second input stage is enabled during a low-power mode of operation; and
a switchable clamp coupled to an output for the first and second input stages for the first and second cascode amplifiers, the switchable clamp being enabled during the low-power mode of operation to hold the output to a voltage.

5. The power amplifier of claim 4, wherein the output stages for the first and second cascode amplifiers comprise an NMOS transistor.

6. The power amplifier of claim 5, wherein the gates for the NMOS transistor are biased with a first voltage in the high-power mode of operation and a second voltage during the low-power mode of operation, the second voltage being higher than the first voltage.

7. The power amplifier of claim 4, wherein the first input stages and the second input stages for the first and second cascode amplifiers each comprises a plurality of NMOS transistors, wherein the switchable clamp comprises first PMOS transistors coupled to the output for the second input stage of the first cascode amplifier, and wherein the switchable clamp comprises second PMOS transistors coupled to the output for the second input stage of the second cascode amplifier.

8. The power amplifier of claim 4, further comprising a clamp enable signal coupled to an enable circuit with the switchable clamp.

9. The power amplifier of claim 1, further comprising a first enable signal coupled to enable circuits within the first input stages and a second enable signal coupled to enable circuits within the second input stages.

10. The power amplifier of claim 1, further comprising a first tunable capacitance coupled to the output stage for the first cascode amplifier, and a second tunable capacitance coupled to the output stage for the second cascode amplifier, the first and second tunable capacitances having varied capacitances based upon the low-power and high-power modes of operation.

11. A method to amplify output signals, comprising:
receiving a differential input including a positive (P) input and a negative (N) input;
providing the P input to a first cascode amplifier comprising:
an output stage having a positive (P) output;
a first input stage coupled to the output stage; and
a second input stage coupled to the output stage;
providing the N input to a second cascode amplifier comprising:
an output stage having a negative (N) output;
a first input stage coupled to the output stage; and
a second input stage coupled to the output stage;
for a high-power mode of operation, enabling the first input stages and the second input stages for the first and second cascode amplifiers;
for a low-power mode of operation, disabling the first input stages for the first and second cascode amplifiers and enabling the second input stages for the first and second cascode amplifiers,
wherein the output stages for the first and second cascode amplifiers comprise an NMOS transistor; and
biasing the gates for the NMOS transistor with a first voltage in the high-power mode of operation and a second voltage during the low-power mode of operation, the second voltage being higher than the first voltage.

12. The method of claim 11, wherein the first input stages and the second input stages for the first and second cascode amplifiers each comprises a plurality of NMOS transistors.

13. The method of claim 12, wherein the plurality of NMOS transistors comprise binary-weighted NMOS transistors.

14. A method to amplify output signals, comprising:
receiving a differential input including a positive (P) input and a negative (N) input;
providing the P input to a first cascode amplifier comprising:
an output stage having a positive (P) output;
a first input stage coupled to the output stage; and
a second input stage coupled to the output stage;
providing the N input to a second cascode amplifier comprising:
an output stage having a negative (N) output;
a first input stage coupled to the output stage; and
a second input stage coupled to the output stage;
for a high-power mode of operation, enabling the first input stages and the second input stages for the first and second cascode amplifiers;
for a low-power mode of operation, disabling the first input stages for the first and second cascode amplifiers and enabling the second input stages for the first and second cascode amplifiers; and
enabling a switchable clamp during the low-power mode of operation, the switchable clamp being coupled to an output for the first and second input stages for the first and second cascode amplifiers, and holding the output to a voltage during the low-power mode of operation.

15. The method of claim 14, wherein the output stages for the first and second cascode amplifiers comprise an NMOS transistor, the method further comprising:
biasing the gates for the NMOS transistor with a first voltage in the high-power mode of operation and a second voltage during the low-power mode of operation, the second voltage being higher than the first voltage.

16. The method of claim 14, wherein the first input stages and the second input stages for the first and second cascode amplifiers each comprises a plurality of NMOS transistors, wherein the switchable clamp comprises first PMOS transistors coupled to the output for the second input stage of the first cascode amplifier, and wherein the switchable clamp comprises second PMOS transistors coupled to the output for the second input stage of the second cascode amplifier.

17. The method of claim 14, further comprising applying a clamp enable signal to an enable circuit within the switchable clamp to enable and to disable the switchable clamp.

18. The method of claim 11, further comprising applying a first enable signal to enable circuits within the first input stages to enable and disable the first input stages, and applying a second enable signal to enable circuits within the second input stages to enable and disable the second input stages.

19. The method of claim 11, further comprising loading the first cascode amplifier with a first tunable capacitance, loading the second cascode amplifier with a second tunable capacitance, and varying the first and second tunable capacitances based upon the low-power and high-power modes of operation.

20. The power amplifier of claim 4, wherein the first input stages and the second input stages for the first and second cascode amplifiers each comprises a plurality of NMOS transistors.

21. The power amplifier of claim 20, wherein the plurality of NMOS transistors comprise binary-weighted NMOS transistors.

22. The power amplifier of claim 4, further comprising a first enable signal coupled to enable circuits within the first input stages and a second enable signal coupled to enable circuits within the second input stages.

23. The power amplifier of claim 4, further comprising a first tunable capacitance coupled to the output stage for the first cascode amplifier, and a second tunable capacitance coupled to the output stage for the second cascode amplifier, the first and second tunable capacitances having varied capacitances based upon the low-power and high-power modes of operation.

* * * * *